(12) United States Patent
Kim et al.

(10) Patent No.: US 8,455,359 B2
(45) Date of Patent: Jun. 4, 2013

(54) SEMICONDUCTOR DEVICES AND METHODS OF MANUFACTURING THE SAME

(75) Inventors: Kook-Joo Kim, Seongnam-si (KR); Jin-Ho Kim, Hwaseong-si (KR); Seung-Ki Chae, Seoul (KR); Pil-Kwon Jun, Seoul (KR); Sun-Hee Park, Hwaseong-si (KR); Gyoung-Eun Byun, Pyeongtaek-si (KR)

(73) Assignee: Samsung Electronics Co., Ltd., Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 13/289,107

(22) Filed: Nov. 4, 2011

(65) Prior Publication Data

US 2012/0196439 A1    Aug. 2, 2012

(30) Foreign Application Priority Data

Jan. 31, 2011 (KR) .............................. 2011-0009334

(51) Int. Cl.
*H01L 21/44* (2006.01)
*H01L 21/4763* (2006.01)

(52) U.S. Cl.
USPC ......................................... 438/672; 438/622

(58) Field of Classification Search
USPC .. 438/586, 622, 672, 685, 253, 678; 257/536, 257/E21.576, E21.58, E21.583, E23.145, 257/E23.167
See application file for complete search history.

(56) References Cited

U.S. PATENT DOCUMENTS

| 6,468,894 | B1 * | 10/2002 | Yang et al. ..................... 438/622 |
| 2001/0044181 | A1 * | 11/2001 | Nakamura ..................... 438/253 |
| 2005/0255687 | A1 * | 11/2005 | Jiang et al. ..................... 438/622 |
| 2010/0007021 | A1 | 1/2010 | Choo et al. | |

FOREIGN PATENT DOCUMENTS

| JP | 11-233622 | 8/1999 |
| KR | 10-2003-0080525 A | 10/2003 |
| KR | 10-2010-0006756 A | 1/2010 |

\* cited by examiner

*Primary Examiner* — N Drew Richards
*Assistant Examiner* — Christina Sylvia
(74) *Attorney, Agent, or Firm* — Muir Patent Consulting, PLLC

(57) ABSTRACT

In a method of forming a conductive pattern structure of a semiconductor device, a first insulating interlayer is formed on a substrate. A first wiring is formed to pass through the first insulating interlayer. An etch stop layer and a second insulating interlayer are sequentially formed on the first insulating interlayer. A second wiring is formed to pass through the second insulating interlayer and the etch stop layer. A dummy pattern is formed to pass through the second insulating layer and the etch stop layer at the same time as forming the second wiring. The second wiring is electrically connected to the first wiring. The dummy pattern is electrically isolated from the second wiring.

20 Claims, 15 Drawing Sheets

SEMICONDUCTOR DEVICES AND METHODS OF MANUFACTURING THE SAME

CROSS-REFERENCE TO RELATED APPLICATION

This application claims priority under 35 USC §119 to Korean Patent Application No. 2011-0009334, filed on Jan. 31, 2011 in the Korean Intellectual Property Office (KIPO), the contents of which are herein incorporated by reference in their entirety.

BACKGROUND

Example embodiments relate to semiconductor devices and methods of manufacturing the same. More particularly, example embodiments relate to semiconductor devices having a high reliability and methods of manufacturing the same.

As the speed of semiconductor circuits increases, wirings may be formed in a relatively small area at a plurality of levels. During the formation of the multi-layered wirings, gas may not be exhausted outward but may be trapped in layers. The gas may be exhausted by heat, however, the exhaust path of the gas may increase due to the height of the wirings, and the material of the layers may be diversified so that the gas may not be easily exhausted outward. When the gas is trapped in the layers, the reliability of the semiconductor device deteriorates. In order to improve the reliability of the semiconductor device, a heat treatment process for outgassing may be preformed intensively, however, it may cause an increase in a process time and a process cost.

SUMMARY

Example embodiments provide a semiconductor device having a high reliability.

Example embodiments provide a method of manufacturing a semiconductor device having a high reliability.

According to example embodiments, there is provided a method of manufacturing a conductive pattern structure of a semiconductor device. In the method, a first insulating interlayer is formed on a substrate. A first wiring is formed to pass through the first insulating interlayer. An etch stop layer and a second insulating interlayer are sequentially formed on the first insulating interlayer. A second wiring is formed to pass through the second insulating layer and the etch stop layer. A dummy pattern is formed to pass through the second insulating layer and the etch stop layer at the same time as forming the second wiring. The second wiring is electrically connected to the first wiring. The dummy pattern is electrically isolated from the second wiring.

According to another example embodiments, an integrated circuit is formed on a substrate. A first insulating layer is formed on the substrate. A first conductive pattern is formed to pass through the first insulating layer. An etch stop layer and a second insulating layer are sequentially formed on the first insulating layer and the first conductive pattern. A contact hole and a dummy contact hole are formed at the same time. The contact hole is formed on the first conductive pattern to pass through the etch stop layer and the second insulating interlayer, and is filled with a conductive material to form a contact plug electrically connected to the first conductive pattern and the integrated circuit. The dummy contact hole is formed on the first insulating interlayer through the etch stop layer and the second insulating interlayer, and is filled with the same conductive material to form a dummy contact plug electrically isolated from the integrated circuit.

According to further example embodiments, an integrated circuit is formed on a substrate. A first insulating layer is formed on the substrate. A plurality of first conductive patterns are formed to pass through the first insulating layer. A second insulating layer and a third insulating layer are sequentially formed on the first insulating layer. A plurality of first contact plugs are formed to electrically connect to the plurality of first conductive patterns, the plurality of first contact plugs formed through the second insulating layer and the third insulating layer. A plurality of second contact plugs are formed to contact the first insulating layer, the plurality of second contact plugs formed through the second insulating layer and the third insulating layer and at the same time as forming the plurality of first contact plugs. The plurality of second contact plugs are electrically isolated from the integrated circuit.

BRIEF DESCRIPTION OF THE DRAWINGS

Example embodiments will be more clearly understood from the following detailed description taken in conjunction with the accompanying drawings.

FIG. 1 is a cross-sectional view illustrating a semiconductor device in accordance with Embodiment 1;

FIG. 2 is a plan view illustrating the semiconductor device of FIG. 1;

FIGS. 3 to 7 are cross-sectional views illustrating an exemplary method of manufacturing the semiconductor device in FIG. 1;

FIG. 8 is a cross-sectional view illustrating a semiconductor device in accordance with Embodiment 2;

FIG. 9 is a plan view illustrating the semiconductor device of FIG. 8;

FIGS. 10 and 11 are cross-sectional views illustrating an exemplary method of manufacturing the semiconductor device in FIG. 8;

FIG. 12 is a cross-sectional view illustrating a semiconductor device in accordance with Embodiment 3;

FIG. 13 is a plan view illustrating the semiconductor device of FIG. 12;

FIGS. 14 to 16 are cross-sectional views illustrating an exemplary method of manufacturing the semiconductor device in FIG. 12;

FIG. 17 is a cross-sectional view illustrating a semiconductor device in accordance with Embodiment 4;

FIGS. 18 to 20 are cross-sectional views illustrating an exemplary method of manufacturing the semiconductor device in FIG. 17;

FIG. 21 is a cross-sectional view illustrating a semiconductor device in accordance with Embodiment 5; and FIGS. 22 to 24 are cross-sectional views illustrating an exemplary method of manufacturing the semiconductor device in FIG. 21.

DETAILED DESCRIPTION OF THE EMBODIMENTS

Figure 1:
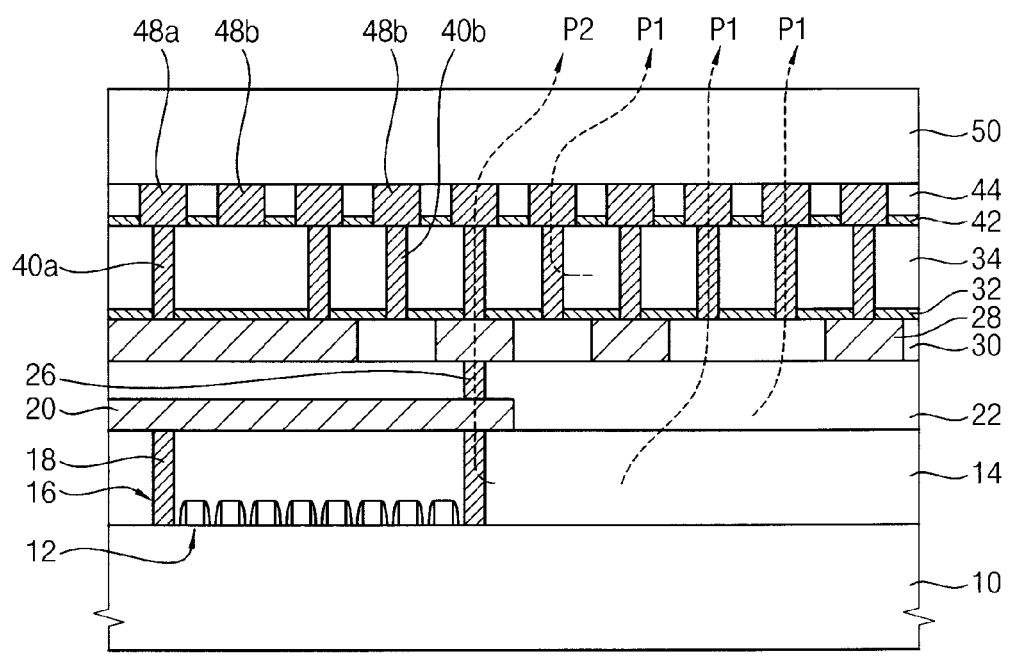
FIGS. 1 to 24 represent non-limiting, example embodiments as described herein.

Various example embodiments will be described more fully hereinafter with reference to the accompanying drawings, in which some example embodiments are shown. The present inventive concept may, however, be embodied in many different forms and should not be construed as limited to the example embodiments set fourth herein. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. Unless indicated otherwise, these terms are only used to distinguish one element, component, region, layer or section from another region, layer or section. Thus, a first element, component, region, layer or section discussed below could be termed a second element, component, region, layer or section without departing from the teachings of the present disclosure.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to limit the scope of the present disclosure.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, example embodiments will be explained in detail with reference to the accompanying drawings.

Figure 2:
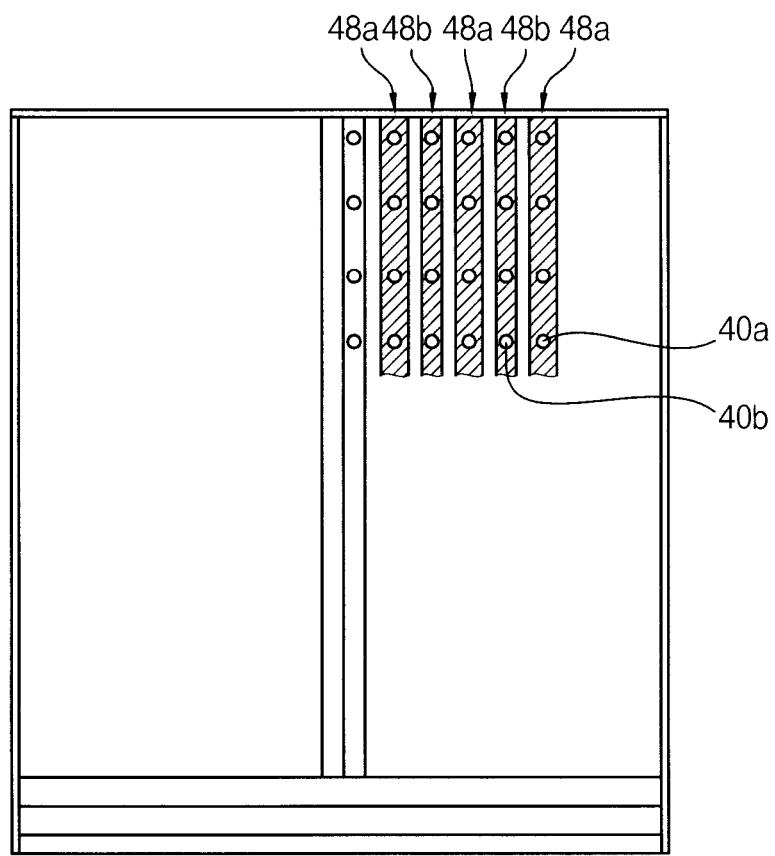

FIG. 1 is a cross-sectional view illustrating a semiconductor device in accordance with Embodiment 1, and FIG. 2 is a plan view illustrating the semiconductor device of FIG. 1.

Referring to FIG. 1, a switching element, e.g., a transistor 12 may be on a substrate 10. For example, the transistor 12 may be part of an integrated circuit including a plurality of switching elements and a plurality of transistors on the substrate 10. The substrate 10 may, for example, be a hard substrate such as a semiconductor substrate, e.g., a silicon substrate, a germanium substrate, a silicon-germanium substrate, a gallium phosphate substrate, a gallium arsenide substrate, a silicon carbide substrate, a silicon-germanium carbide substrate, an indium phosphate substrate, an indium arsenide substrate, etc., a silicon-on-insulator (SOI) substrate, or a glass substrate for a display device. Alternatively, the substrate 10 may be a flexible plastic substrate, e.g., a polyimide substrate, a polyethylene terephthalate (PET) substrate, a polyethylene naphthalate (PEN) substrate, a poly methyl methacrylate (PMMA) substrate, a polycarbonate (PC) substrate, a polyehtersulfone (PES) substrate, a polyester substrate, etc.

A plurality of insulating interlayers covering the transistor 12 may be on the substrate 10. For example, each of the insulating interlayers may comprise a layer of a semiconductor device. Each insulating interlayer may include, for example, silicon oxide. An etch stop layer pattern or a diffusion barrier layer pattern may be between the insulating interlayers. In one embodiment, the etch stop layer pattern and the diffusion barrier layer pattern include an insulating material. Wirings for electrically connecting a source region and/or a drain region of the transistor 12 to an external power source may be formed in the insulating interlayers. In an example embodiment, first to sixth insulating interlayers may be provided.

In one embodiment, a first insulating interlayer 14 covering the transistor 12 may be on the substrate 10. A first contact plug 18 contacting the substrate 10 may be through the first insulating interlayer 14. The first contact plug 18 may fill a first contact hole 16.

A first conductive pattern 20 may be on the first insulating interlayer 14. The first conductive pattern 20 may include, for example, a metal or polysilicon. In one embodiment, the first conductive pattern 20 may serve as an active wiring to connect signals and provide a power supply voltage or a ground voltage for the integrated circuit and the semiconductor device. A second insulating interlayer 22 covering the first conductive pattern 20 may be on the first insulating interlayer 14. A second contact plug 26 electrically connected to the first conductive pattern 20 may be through the second insulating interlayer 22 (e.g., the second contact plug 26 may pass through part of the second insulating interlayer 22).

A second conductive pattern 28 may be on the second insulating interlayer 22. The second conductive pattern 28 may be electrically connected to the first conductive pattern 20, and may serve as an active wiring, for example, to transmit signals and provide a power supply voltage or a ground voltage for the integrated circuit and the semiconductor device. The second conductive pattern 28 may include, for example, a metal. For example, the second conductive pattern 28 may include aluminum (Al), aluminum alloy, copper (Cu), gold (Au), silver (Ag), tungsten (W), molybdenum (Mo), etc. These may be used alone or in a combination thereof. The second conductive pattern 28 may be a single layer or a multi-layer. A third insulating interlayer 30 may include an insulating material that surrounds a sidewall of the second conductive pattern 28 on the second insulating interlayer 22. As such, the third insulating interlayer 30 may include an insulating material patterned around the second conductive pattern 28, such that the second conductive pattern 28 passes through the third insulating interlayer 30.

A first etch stop layer pattern 32 may be on the third insulating interlayer 30 and the second conductive pattern 28. In one embodiment, the first etch stop layer pattern 32 may include silicon nitride, silicon carbide, silicon carbon nitride, etc.

Outgassed gas from underlying layers may not be easily exhausted through the first etch stop layer pattern 32. That is, the first etch stop layer pattern 32 may prevent gas, e.g., water vapor, hydrogen gas, oxygen gas, and nitrogen gas from being exhausted outward, and may change a path of the gas back to the substrate 10.

A fourth insulating interlayer 34 may be on the first etch stop layer pattern 32. A third contact plug 40a may be through the fourth insulating interlayer 34 and the first etch stop layer pattern 32, and contact the second conductive pattern 28. A dummy contact plug 40b may be through the fourth insulating interlayer 34 and the first etch stop layer pattern 32, and contact the third insulating interlayer 30 (e.g., it may contact the insulating material of the third insulating interlayer 30). In one embodiment, the dummy contact plug 40b and the third contact plug 40a are formed at the same time.

The third contact plug 40a may make direct contact with the second conductive pattern 28, so that the first etch stop layer pattern 32 may not be beneath the third contact plug 40a. In addition, the dummy contact plug 40b may make direct contact with the third insulating layer 30, so that the first etch stop layer pattern 32 may not be beneath the dummy contact plug 40b. Thus, the first etch stop layer pattern 32 may be neither beneath the third contact plug 40a nor beneath the dummy contact plug 40b, so that gas, e.g., water vapor, hydrogen gas, oxygen gas, and nitrogen gas may be easily exhausted through the third contact plug 40a and the dummy contact plug 40b instead of remaining in the layers.

In one embodiment, the third contact plug 40a and the dummy contact plug 40b include the same metal. The third contact plug 40a and the dummy contact plug 40b may include, for example, a metal that water vapor and gas may easily pass through. For example, the third contact plug 40a and the dummy contact plug 40b may include copper, aluminum, etc.

In one embodiment, the dummy contact plug 40b in formed in a cell region and/or a peripheral region in which active wirings are not formed. Therefore, the number and the size of the dummy contact plug 40b may be controlled, so that the exhaust path of water vapor and gas may increase.

The dummy contact plug 40b may be electrically isolated from underlying wirings. For example, in one embodiment, the dummy contact plug 40b does not electrically connect to the second conductive pattern 28 or any signal or voltage carrying conductor of the integrated circuit. For example, in one embodiment, the dummy contact plug 40b does not electrically connect to any terminals of the integrated circuit that carry signals, power, or ground voltage.

A third conductive pattern 48a making contact with the third contact plug 40a may be on the fourth insulating interlayer 34. A dummy conductive pattern 48b making contact with the dummy contact plug 40b may be on the fourth insulating interlayer 34. In one embodiment, the dummy conductive pattern 48b does not serve as an active wiring. For example, in one embodiment, the dummy conductive pattern 48b does not electrically connect to the third conductive pattern 48a or any signal or voltage carrying of the integrated circuit. For example, in one embodiment, the dummy conductive pattern 48b does not electrically connect to any terminals of the integrated circuit that carry signals, power, or ground voltage. In one embodiment, the dummy conductive pattern 48b and the third conductive pattern 48a are formed at the same time. The dummy conductive pattern 48b may serve as an exhaust path for gas included in layers.

In one embodiment, the third conductive pattern 48a and the dummy conductive pattern 48b may include the same metal. In order to easily exhaust water vapor and gas, the third conductive pattern 48a and the dummy conductive pattern 48b may include a metal that water vapor and gas may easily pass through. For example, the third conductive pattern 48a and the dummy conductive pattern 48b may include copper.

A second etch stop layer pattern 42 surrounding sidewalls of the third conductive pattern 48a and the dummy conductive pattern 48b may be on the fourth insulating interlayer 34. For example, the second etch stop layer pattern 42 may include silicon nitride, silicon carbide, silicon carbon nitride, etc.

The second etch stop layer pattern 42 may be neither between the fourth insulating interlayer 34 and the third conductive pattern 48a nor between the fourth insulating interlayer 34 and the dummy conductive pattern 48b. Thus, the second etch stop layer pattern 42 does not prevent water vapor and gas from being exhausted through the third conductive pattern 48a and the dummy conductive pattern 48b, so that water vapor and gas may be easily exhausted through the third conductive pattern 48a and the dummy conductive pattern 48b.

A fifth insulating interlayer 44 may be on the second etch stop layer pattern 42. A sixth insulating interlayer 50 may be on the fifth insulating interlayer 44, the third conductive pattern 48a, and the dummy conductive pattern 48b.

In a region where the first and second etch stop layer patterns 32 and 42 are formed, some gas and water vapor included in layers may not be exhausted, and may change their moving direction toward the substrate 10 to remain in the layers. According to example embodiments, the dummy contact plug 40b and the dummy conductive pattern 48b may serve as an additional exhaust path P1 for gas and water vapor. As such, portions of the insulating interlayers 14, 22, 30, 34, 44, and 50, the conductive patterns 20, 28, and 48a, the dummy conductive pattern 48b, the contact plugs 18, 26, and 40a, and the dummy contact plug 40b where the first and second etch stop layer patterns 32 and 42 are not disposed can serve as exhaust paths P1 and P2 for gas and water vapor.

For example, when gas, e.g., water vapor, hydrogen gas, oxygen gas, and nitrogen gas are not exhausted outward and are trapped in the substrate 10 or in a gate oxide layer of the transistor 12, the electrical characteristics of the transistor 12 may be changed. Thus, the operation characteristics of the semiconductor device may deteriorate, and the reliability of the semiconductor device may become poor. However, the semiconductor device in accordance with example embodiments may have many exhaust paths for gas and water vapor, so that gas and water vapor may be quickly exhausted. Thus, the semiconductor device may have improved operation characteristics.

FIGS. 3 to 7 are cross-sectional views illustrating an exemplary method of manufacturing the semiconductor device in FIG. 1.

Figure 3:
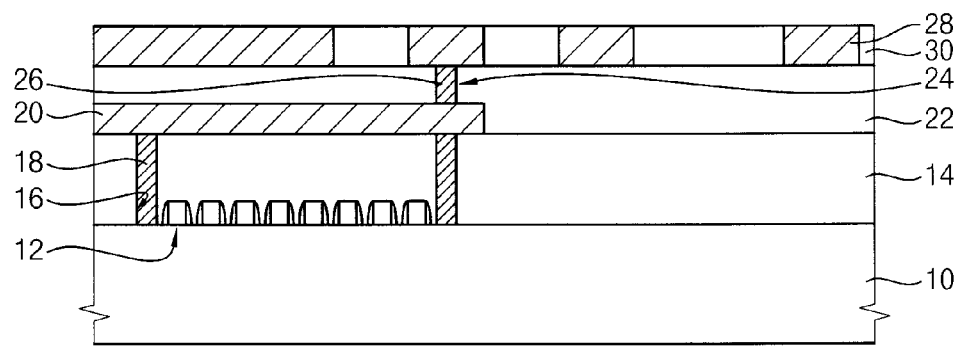

Referring to FIG. 3, a switching element, e.g., a transistor 12 may be formed on a substrate 10. For example, the transistor 12 may be part of an integrated circuit including a plurality of switching elements and a plurality of transistors formed on the substrate 10. A first insulating interlayer 14 may be formed on the substrate 10 to cover the switching element. The first insulating interlayer 14 may be formed, for example, by a plasma enhanced chemical vapor deposition (PECVD) process, a high density plasma chemical vapor deposition (HDP-CVD) process, an atmospheric pressure chemical vapor deposition (APCVD) process, a spin coating process, etc. The first insulating interlayer 14 may be formed using an insulating material, such as, e.g., silicon oxide. The first insulating interlayer 14 may be partially etched to form a first contact hole 16 exposing a top surface of the substrate 10. The first contact hole 16 may be filled with a conductive material to form a first contact plug 18.

A first conductive layer may be formed on the first insulating interlayer 14 and the first contact plug 18. The first conductive layer may be formed to include a metal or polysilicon. The first conductive layer may be patterned to form a first conductive pattern 20 electrically connected to the first contact plug 18. The first conductive pattern 20 may be electrically connected to the first contact plug 18, thereby serving as a wiring of the semiconductor device.

A second insulating interlayer 22 may be formed on the first insulating interlayer 14 to cover the first conductive pattern 20. The second insulating interlayer 22 may be partially etched to form a second contact hole 24 exposing a top surface of the first conductive pattern 20. The second contact hole 24 may be filled with a conductive material to form a second contact plug 26. The second contact plug 26 may be formed to include, for example, a metal or polysilicon.

A second conductive layer may be formed on the second insulating interlayer 22 and the second contact plug 26. The second conductive layer may be formed to include, for example, a metal or polysilicon. The second conductive layer may be patterned to form a second conductive pattern 28 electrically connected to the second contact plug 26. A third insulating interlayer 30 may be formed on the second insulating interlayer 22 to surround a sidewall of the second conductive pattern 28. In one embodiment, the third insulating interlayer 30 is formed after the second conductive pattern 28, and the second conductive pattern 28 is formed to pass through the insulating interlayer 30. Alternatively, the third insulating interlayer 30 may be formed prior to the second conductive pattern 28.

Figure 4:
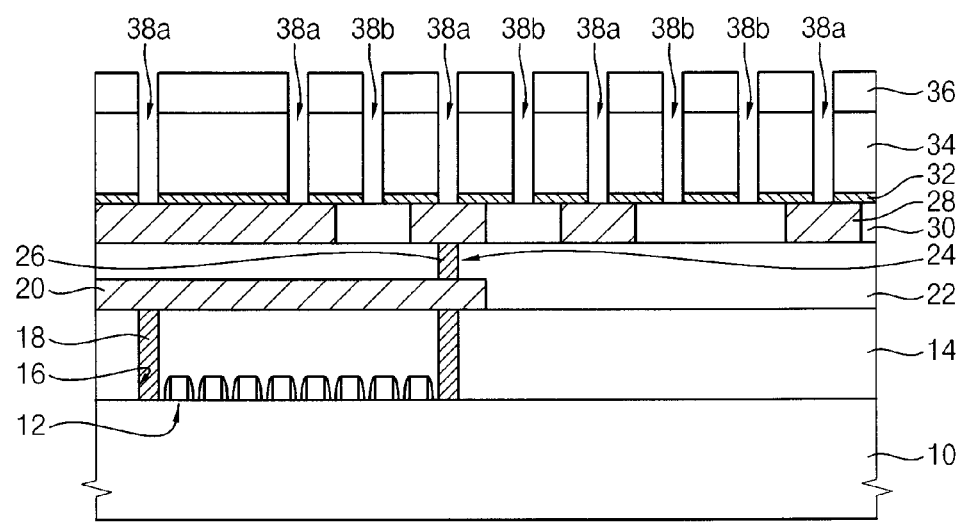

Referring to FIG. 4, a first etch stop layer may be formed on the third insulating interlayer 30 and the second conductive pattern 28. The first etch stop layer may be formed using a material, e.g., silicon nitride, silicon carbide, silicon carbon nitride, etc. A fourth insulating interlayer 34 may be formed on the first etch stop layer.

A first photoresist pattern 36 may be formed on the fourth insulating interlayer 34. The fourth insulating interlayer 34 and the first etch stop layer may be etched using the first photoresist pattern 36 as an etching mask. Accordingly, a third contact hole 38a and a dummy contact hole 38b may be formed through the fourth insulating interlayer 34 and the first etch stop layer. In an example embodiment, the third contact hole 38a and the dummy contact hole 38b may be formed simultaneously by a single etching process, and an additional process for forming the dummy contact hole 38b is not required. During the etching process, the first etch stop layer may be partially removed to form a first etch stop layer pattern 32.

The third contact hole 38a may expose a top surface of the second conductive pattern 28. The dummy contact hole 38b may expose a top surface of the third insulating interlayer 30. The dummy contact hole 38b may be formed in a cell region and/or a peripheral region of the substrate 10 in which the third contact hole 38a may not be formed.

After forming the third contact hole 38a and the dummy contact hole 38b, the first photoresist pattern 36 may be removed.

Figure 5:
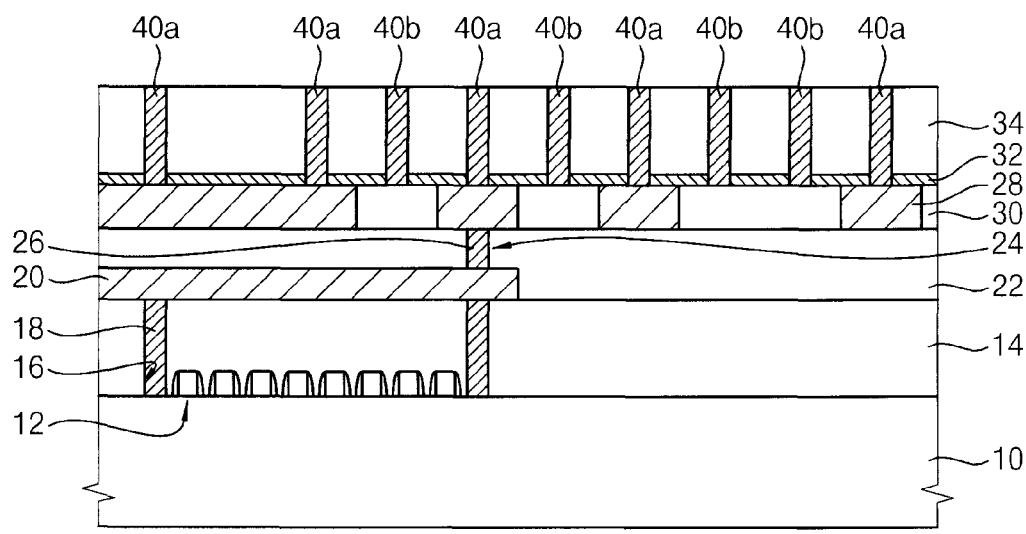

Referring to FIG. 5, a first barrier layer (not shown) may be formed on the exposed top surfaces of the second conductive pattern 28 and the third insulating interlayer 30, and sidewalls of the third contact hole 38a and the dummy contact hole 38b. The first barrier layer may be formed using, e.g., titanium, titanium nitride, tantalum, tantalum nitride, etc. A first metal layer (not shown) may be formed on the first barrier layer to fill the third contact hole 38a and the dummy contact hole 38b. The first metal layer may be formed using a metal through which water vapor or gas may easily pass. The first metal layer may be formed to include, e.g., aluminum (Al), aluminum alloy, copper (Cu), silver (Ag), tungsten (W), molybdenum (Mo), etc. These may be used alone or in a combination thereof. The first metal layer may be formed by a CVD process, an electroplating process, a sputtering process followed by a reflow process, etc. In an example embodiment, the first metal layer is formed to include copper by an electroplating process.

The first metal layer and the first barrier layer may be planarized by a chemical mechanical planarization (CMP) process to form a third contact plug 40a and a dummy contact plug 40b. In an example embodiment, the third contact plug 40a and the dummy contact plug 40b may be formed during the formation of the first metal layer and the planarization. Accordingly, an additional process for forming the dummy contact plug 40b may not be required.

Figure 6:
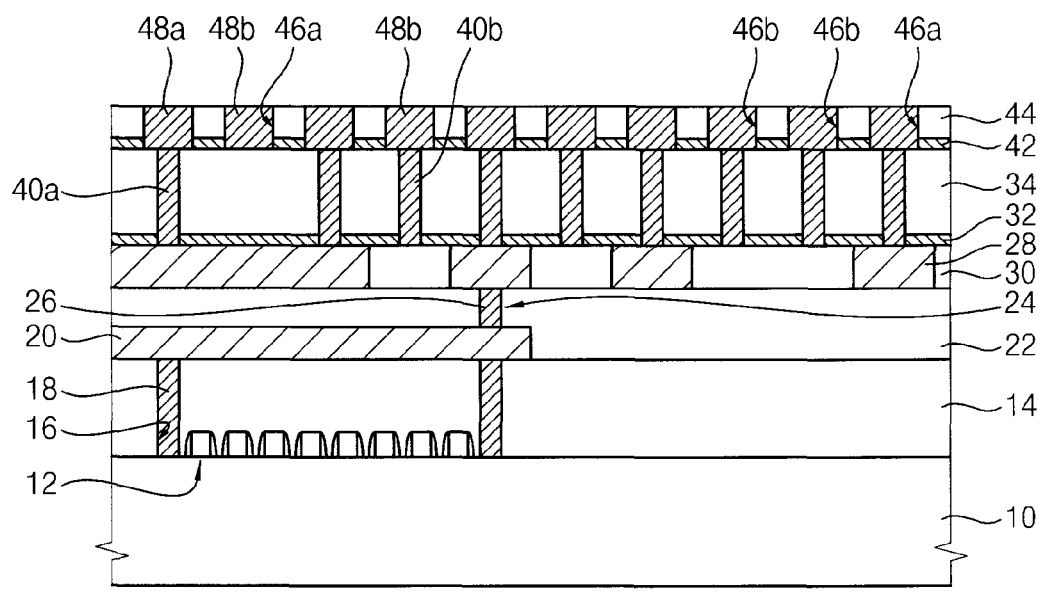

Referring to FIG. 6, a second etch stop layer may be formed on the fourth insulating interlayer 34 containing the third contact plug 40a and the dummy contact plug 40b therethrough. The second etch stop layer may be formed using, e.g., silicon nitride, silicon carbide, silicon carbon nitride, etc. A fifth insulating interlayer 44 may be formed on the second etch stop layer.

A second photoresist pattern (not shown) may be formed on the fifth insulating interlayer 44. The fifth insulating interlayer 44 and the second etch stop layer may be etched by using the second photoresist pattern as an etching mask to form an opening 46a and a dummy opening 46b. The opening 46a and the dummy opening 46b may be formed simultaneously by a single etching process. Accordingly, an additional process for forming the dummy opening 46b is not required. In the etching process, the second etch stop layer may be partially removed to form a second etch stop layer pattern 42.

A top surface of the third contact plug 40a may be exposed by the opening 46a. A top surface of the fourth insulating interlayer 34 or the dummy contact plug 40b may be partially exposed by the dummy opening 46b.

A second barrier layer (not shown) may be formed on the exposed top surfaces of the third contact plug 40a, the dummy contact plug 40b and the fourth insulating interlayer 34 and inner walls of the opening 46a and the dummy opening 46b.

The second barrier layer may be formed using, e.g., titanium, titanium nitride, tantalum, tantalum nitride, etc. A second metal layer (not shown) may be formed on the second barrier layer to fill the opening 46a and the dummy opening 46b. The second metal layer may be formed using a metal through which water vapor or gas may easily pass. The second metal layer may be formed to include, e.g., aluminum (Al), aluminum alloy, copper (Cu), silver (Ag), tungsten (W), molybdenum (Mo), etc. These may be used alone or in a combination thereof. In example embodiments, the second metal layer may include copper by an electroplating process.

The second metal layer and the second barrier layer may be planarized by a CMP process to form a third conductive pattern 48a and a dummy conductive pattern 48b. The third conductive pattern 48a and the dummy conductive pattern 48b are therefore formed simultaneously during the formation of the second metal layer and the planarization. Accordingly, an additional process for forming the dummy conductive pattern 48b may not be required.

A deposition process and a patterning process for forming the third conductive pattern 48a and the dummy conductive pattern 48b may be performed at a relatively high temperature. When the processes are performed at a high temperature, gas, e.g., water vapor, hydrogen gas, oxygen gas, and nitrogen gas included in underlying layers may be exhausted by a heat. An exhaust path for water vapor and gas may be increased by the dummy contact plug 40b and the dummy conductive pattern 48b, so that water vapor and gas may be quickly removed from the underlying layers. An additional heat treatment process for removing water vapor and gas may not be required due to the dummy contact plug 40b and the dummy conductive pattern 48b.

Figure 7:
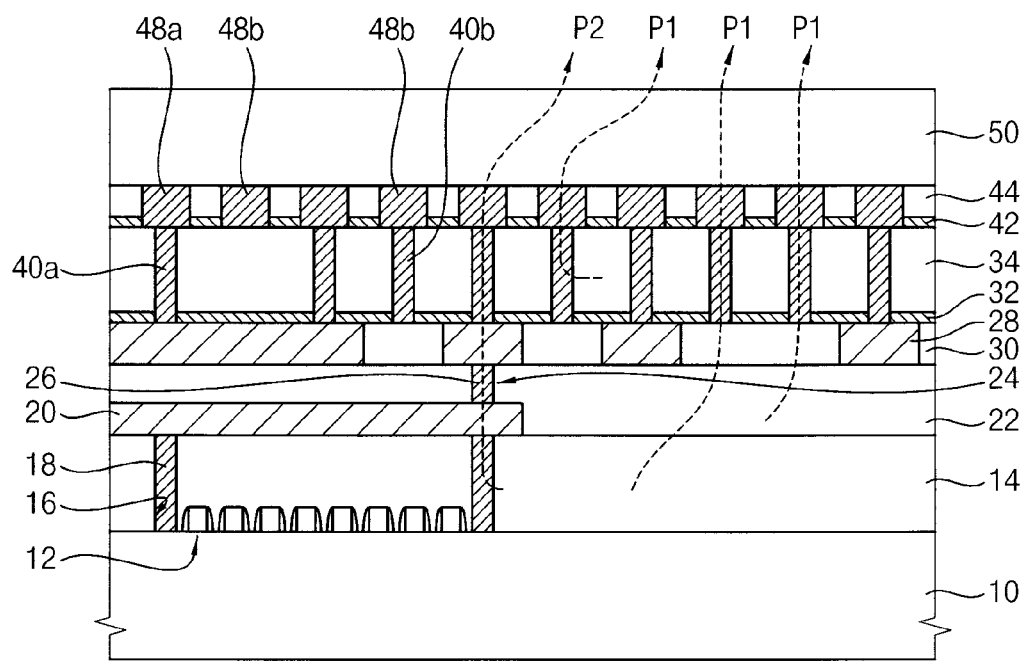

Referring to FIG. 7, a sixth insulating interlayer 50 may be formed on the fifth insulating interlayer 44 containing the third conductive pattern 48a and the dummy conductive pattern 48b therethrough.

Wirings (not shown) including a contact plug and a conductive pattern and dummy patterns (not shown) including a dummy contact plug and a dummy conductive pattern may be repeatedly formed on the sixth insulating interlayer 50.

According to example embodiments, the semiconductor device may include the dummy contact plug 40b and the dummy conductive pattern 48b that may not transfer electrical signals, as well as the contact plugs 18, 26, and 40a, and the conductive patterns 20, 28, and 48a serving as wirings for electrical signal transfer. The first and second etch stop layer patterns 32 and 42 may not be disposed between the insulating interlayers and the contact plugs 18, 26 and 40a, the conductive patterns 20, 28 and 48a, the dummy contact plug 40b, and the dummy conductive pattern 48b. Therefore, during processes for manufacturing the semiconductor device at a relatively high temperature, gas, e.g., water vapor, hydrogen gas, oxygen gas, and nitrogen gas may be easily exhausted through the contact plugs 18, 26 and 40a, the conductive patterns 20, 28 and 48a, the dummy contact plug 40b, and the dummy conductive pattern 48b. The processes may include a deposition process, a heat treatment process, an activation process, etc. The dummy contact plug 40b and the dummy conductive pattern 48b may be in any region, so that an exhaust path for gas may be largely increased. The exhaust path for gas may be increased by the dummy contact plug 40b and the dummy conductive pattern 48b, so that gas may be exhausted easily.

The dummy contact plug 40b and the dummy conductive pattern 48b may be formed simultaneously during the formation of the wirings of the semiconductor device without an additional process.

Figure 8:
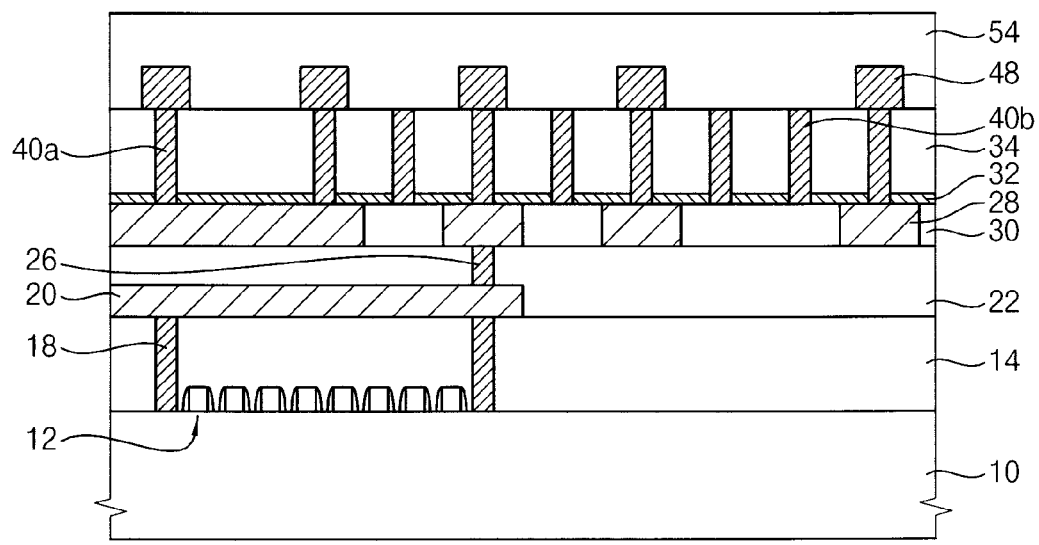
Figure 9:
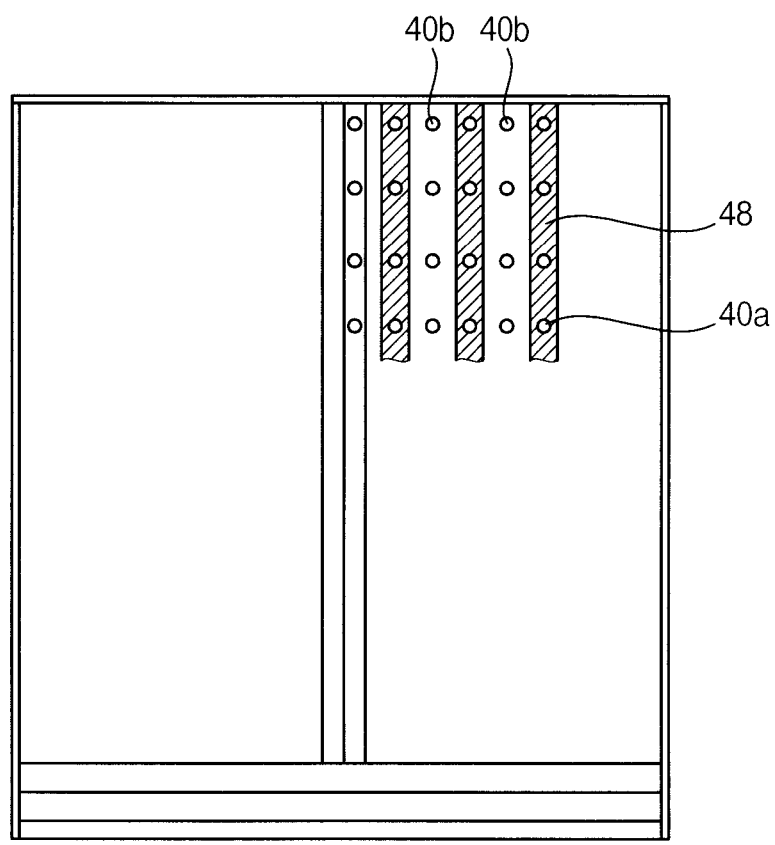

FIG. 8 is a cross-sectional view illustrating a semiconductor device in accordance with Embodiment 2, and FIG. 9 is a plan view illustrating the semiconductor device of FIG. 8.

Referring to FIGS. 8 and 9, a switching element, e.g., a transistor 12 may be on a substrate 10. For example, an integrated circuit including the switching element and a plurality of other switching elements, such as a plurality of transistors, may be on the substrate 10. A first insulating interlayer 14 covering the transistor 12 may be on the substrate 10. A first contact plug 18 contacting the substrate 10 may be through the first insulating interlayer 14. A first conductive pattern 20 may be on the first insulating interlayer 14 and the first contact plug 18. A second insulating interlayer 22 may cover the first conductive pattern 20. A second contact plug 26 electrically connected to the first conductive pattern 20 may be through the second insulating interlayer 22. A second conductive pattern 28 may be on the second insulating interlayer 22. The second conductive pattern 28 may be electrically connected to the first conductive pattern 20, and may serve as an active wiring of the semiconductor device. The second conductive pattern 28 may include a metal. In an example embodiment, the second conductive pattern 28 may include tungsten or copper. A third insulating interlayer 30 may surround a sidewall of the second conductive pattern 28 on the second insulating interlayer 22.

A first etch stop layer pattern 32 may be on the third insulating interlayer 30 and the second conductive pattern 28. A fourth insulating interlayer 34 may be on the first etch stop layer pattern 32.

A third contact plug 40a may make contact with the second conductive pattern 28 through the fourth insulating interlayer 34 and the first etch stop layer pattern 32. Additionally, a dummy contact plug 40b may make contact with the third insulating interlayer 30 through the fourth insulating interlayer 34 and the first etch stop layer pattern 32. In one embodiment, the third contact plug 40a and the dummy contact plug 40b are formed at the same time.

The dummy contact plug 40b may make direct contact with the third insulating interlayer 30, so that the first etch stop layer pattern 32 may not be beneath the dummy contact plug 40b. Thus, the dummy contact plug 40b may serve as an exhaust path of water vapor and gas generated during a semiconductor manufacturing process. The dummy contact plug 40b may be in any region in which active wirings are not formed. The dummy contact plug 40b may be in a cell region and/or a peripheral region of the substrate 10. The number and the size of the dummy contact plug 40b may be controlled so that the exhaust path of water vapor and gas may increase.

In one embodiment, the third contact plug 40a and the dummy contact plug 40b include the same metal. The third contact plug 40a and the dummy contact plug 40b may include a metal that water vapor and gas may easily pass through. For example, the third contact plug 40a and the dummy contact plug 40b may include copper, aluminum, etc.

The third contact plug 40a may serve as an active wiring, while the dummy contact plug 40b may not serve as an active wiring. Therefore, in one embodiment, the dummy contact plug 40b is electrically isolated from underlying wirings or the integrated circuit of the substrate 10.

A third conductive pattern 48 making contact with the third contact plug 40a may be on the fourth insulating interlayer 34. A fifth insulating interlayer 54 covering the third conductive pattern 48 may be on the fourth insulating interlayer 34.

A second etch stop layer pattern (not shown) may be further on the fourth insulating interlayer 34.

In the semiconductor device, the dummy contact plug 40b may serve as an additional exhaust path of gas and water vapor included in layers. The exhaust path of gas and water vapor may increase, so that gas and water vapor trapped in the layers may be easily exhausted.

Figure 10:
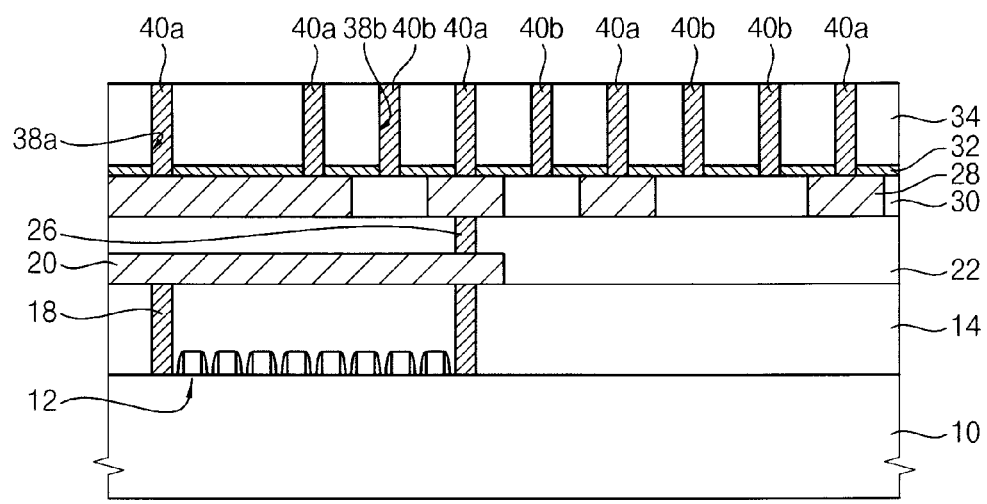
Figure 11:
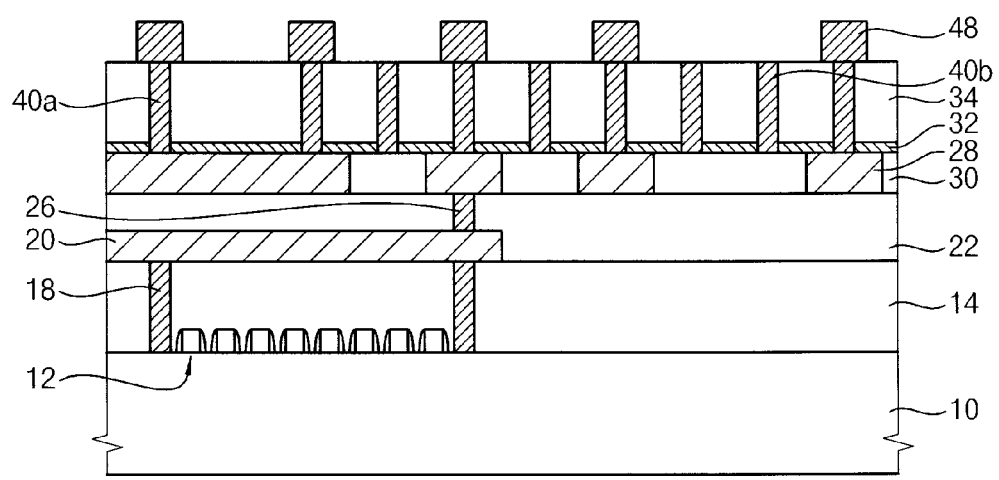

FIGS. 10 and 11 are cross-sectional views illustrating an exemplary method of manufacturing the semiconductor device in FIG. 8.

Referring to FIG. 10, a switching element, e.g., a transistor 12 may be formed on a substrate 10. For example, the transistor 12 may be part of an integrated circuit including a plurality of switching elements and a plurality of transistors formed on the substrate 10. A first insulating interlayer 14 may be formed on the substrate 10 to cover the switching element. A first contact plug 18 may be formed through the first insulating interlayer 14. A first conductive pattern 20 electrically connected to the first contact plug 18 may be formed on the first insulating interlayer 14. A second insulating interlayer 22 covering the first conductive pattern 20 may be formed on the first insulating interlayer 14, and a second contact plug 26 may be formed through the second insulating interlayer 22 to be electrically connected to the first conductive pattern 20. A second conductive pattern 28 electrically connected to the second contact plug 26 may be formed on the second insulating interlayer 22. A third insulating interlayer 30 may be formed on the second insulating interlayer 22 to surround a sidewall of the second conductive pattern 28.

Processes for forming insulating interlayers and wirings may be substantially the same as or similar to those illustrated with reference to FIG. 3. By performing the processes, a structure illustrated in the FIG. 3 may be formed.

A first etch stop layer may be formed on the third insulating interlayer 30 and the second conductive pattern 28. A fourth insulating interlayer 34 may be formed on the first etch stop layer. A first photoresist pattern (not shown) may be formed on the fourth insulating interlayer 34. The fourth insulating interlayer 34 and the first etch stop layer may be etched using the first photoresist pattern as an etching mask. Thus, a third contact hole 38a and a dummy contact hole 38b may be formed through the fourth insulating interlayer 34 the first etch stop layer.

The third contact hole 38a may expose a top surface of the second conductive pattern 28. The dummy contact hole 38b may partially expose a top surface of the third insulating interlayer 30. The dummy contact hole 38b may be formed in any region including a cell region and a peripheral region in which the third contact hole 38a may not be formed.

The third contact hole 38a and the dummy contact hole 38b may be formed simultaneously by a single etching process. Therefore, an additional process for forming the dummy contact hole 38b may not be required. In the etching process, the first etch stop layer may be partially removed to form a first etch stop layer pattern 32. After forming the third contact hole 38a and the dummy contact hole 38b, the first photoresist pattern may be removed.

A barrier layer may be formed on the exposed top surfaces of the second conductive pattern 28 and the third insulating interlayer 30, and sidewalls of the third contact hole 38a and the dummy contact hole 38b. A metal layer may be formed on the barrier layer to fill the third contact hole 38a and the dummy contact hole 38b. The metal layer may be formed using a material through which water vapor and gas may easily pass. The metal layer may be formed to include, e.g., aluminum, aluminum alloy, copper, silver, tungsten, molybdenum, etc. In example embodiments, the metal layer may be formed to include copper layer formed by an electroplating process.

The metal layer and the barrier layer may be planarized by a CMP process to form a third contact plug 40a and a dummy contact plug 40b. In an example embodiment, the third contact plug 40a and the dummy contact plug 40b may be formed during the formation of the metal layer and the planarization. Accordingly, an additional process for forming the dummy contact plug 40b may not be required.

Referring to FIG. 11, a third conductive pattern 48 electrically connected to the third contact plug 40a may be formed on the fourth insulating interlayer 34. In example embodiments, the third conductive pattern 48 may not be formed on the dummy contact plug 40b.

In one embodiment, a conductive layer may be formed on the fourth insulating interlayer 34, and the conductive layer may be patterned to form the third conductive pattern 48. Alternatively, the third conductive pattern 48 may be formed by a damascene process in which a mold layer pattern having an opening therethrough may be formed on the fourth insulating interlayer 34 and a conductive layer may be formed to fill the opening. Before forming the third conductive pattern 48, a second etch stop layer may be further formed on the fourth insulating interlayer 34.

As illustrated in FIG. 8, a fifth insulating interlayer 54 may be formed on the fourth insulating interlayer 34 to cover the third conductive pattern 48.

According to example embodiments, the semiconductor device may include the dummy contact plug 40b that does not transfer electrical signals. On the other hand, the contact plugs 18, 26 and 40a and the conductive patterns 20, 28 and 48 may serve as wirings for electrical signal transfer. Therefore, gas, e.g., water vapor, hydrogen gas, oxygen gas, and nitrogen gas may be easily exhausted through the dummy contact plug 40b. Accordingly, a failure of the semiconductor device due to trapped water vapor or gas in layers may be reduced.

Figure 12:
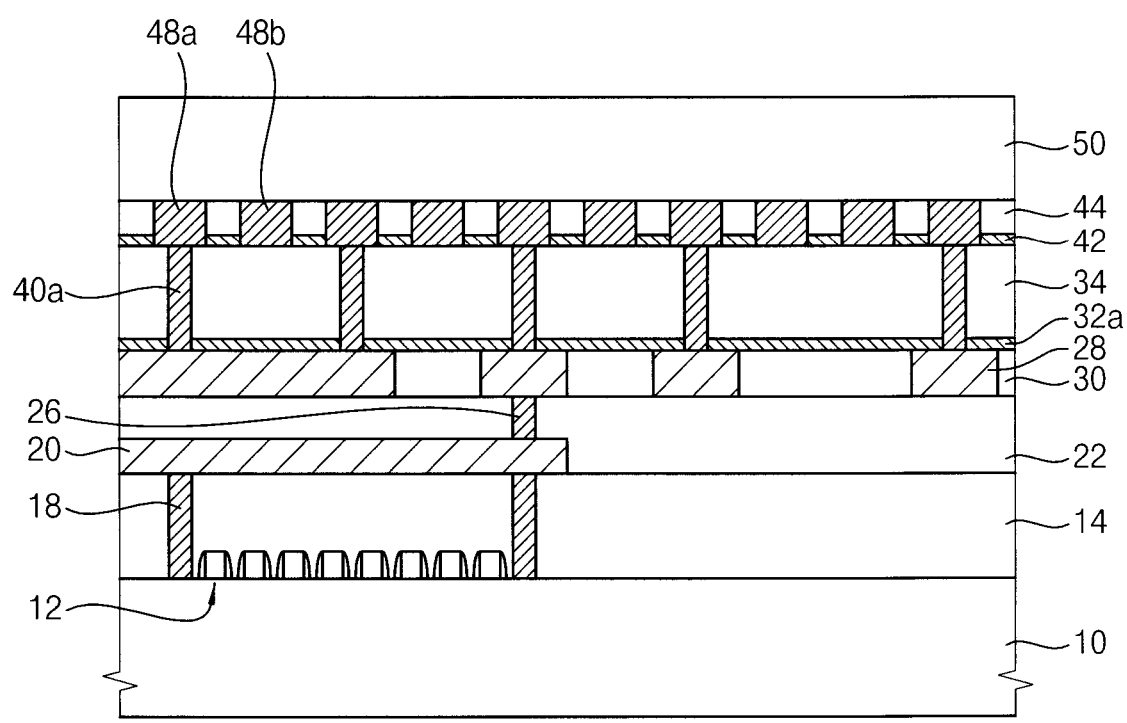
Figure 13:
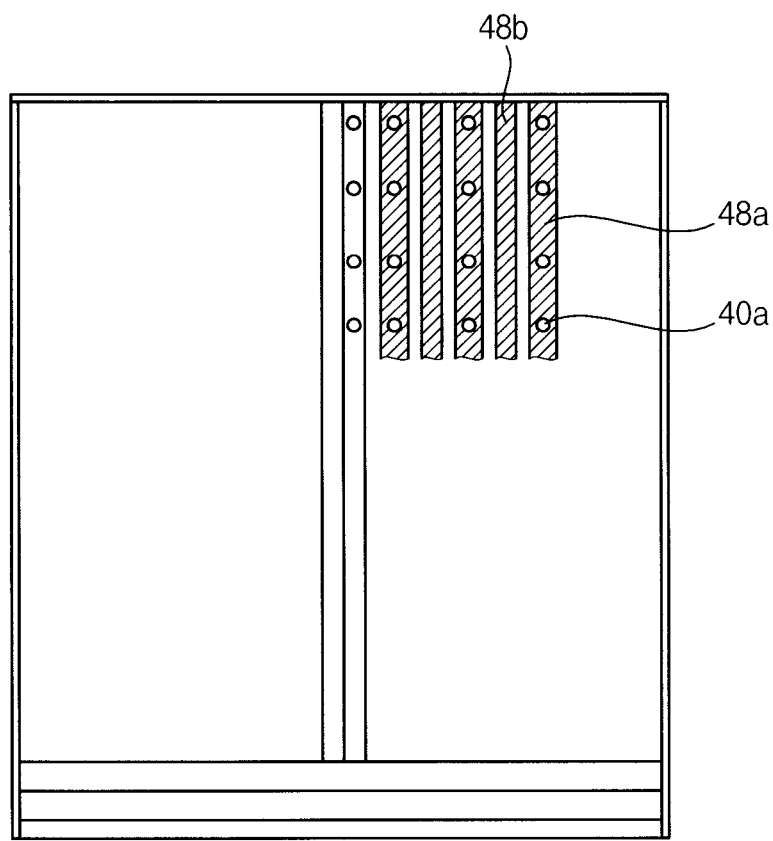

FIG. 12 is a cross-sectional view illustrating a semiconductor device in accordance with Embodiment 3, and FIG. 13 is a plan view illustrating the semiconductor device of FIG. 12.

Referring to FIGS. 12 and 13, a switching element, e.g., a transistor 12 may be on a substrate 10. For example, the transistor 12 may be part of an integrated circuit including a plurality of switching elements and a plurality of transistors formed on the substrate 10. A first insulating interlayer 14 covering the transistor 12 may be on the substrate 10. A first contact plug 18 contacting the substrate 10 may be formed through the first insulating interlayer 14. A first conductive pattern 20 contacting the first contact plug 18 may be on the first insulating interlayer 14. A second insulating interlayer 22 covering the first conductive pattern 20 may be formed on the first insulating interlayer 14. A second contact plug 26 electrically connected to the first conductive pattern 20 may be through the second insulating interlayer 22.

A second conductive pattern 28 may be on the second insulating interlayer 22. A third insulating interlayer 30 may surround a sidewall of the second conductive pattern 28 on the second insulating interlayer 22. A first etch stop layer pattern 32a may be on the third insulating interlayer 30 and the second conductive pattern 28. A fourth insulating interlayer 34 may be on the first etch stop layer pattern 32a.

A third contact plug 40a may make contact with the second conductive pattern 28 through the fourth insulating interlayer 34 and the first etch stop layer pattern 32a. The third contact plug 40a may serve as an active wiring of the semiconductor device.

A third conductive pattern 48a making contact with the third contact plug 40a may be on the fourth insulating interlayer 34. Additionally, a dummy conductive pattern 48b may be formed on the fourth insulating interlayer 34 and at the same time as forming the third conductive pattern 48a. The dummy conductive pattern 48b may not serve as an active wiring. The dummy conductive pattern 48b may serve as exhaust path of gas included in layers.

In one embodiment, the third conductive pattern 48a and the dummy conductive pattern 48b include the same material. For example, the third conductive pattern 48a and the dummy conductive pattern 48b may include a metal that water vapor and gas may easily pass through. The metal may include, e.g., aluminum, aluminum alloy, copper, gold, silver, tungsten, molybdenum, etc.

A second etch stop layer pattern 42 may be on the fourth insulating interlayer 34 and surround sidewalls of the third conductive pattern 48a and the dummy conductive pattern 48b. A fifth insulating interlayer 44 may be on the second etch stop layer pattern 42.

A sixth insulating interlayer 50 may be on the fifth insulating interlayer 44, the third conductive pattern 48a, and the dummy conductive pattern 48b.

In the semiconductor device, the dummy conductive pattern 48b may be an exhaust path of gas and water vapor included in underlying layers. Accordingly the exhaust path of gas and water vapor may increase, so that gas and water vapor trapped in the underlying layer may be easily exhausted.

Figure 14:
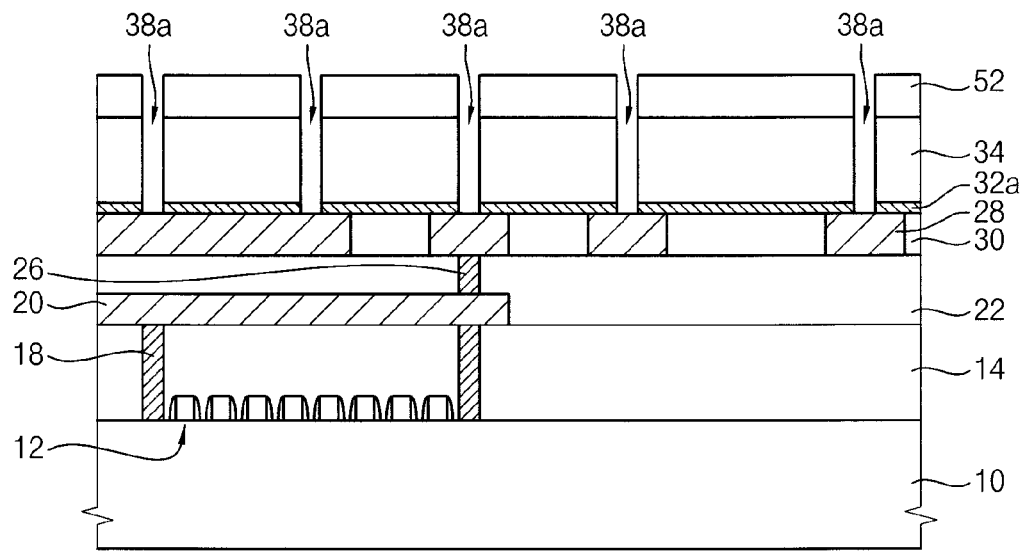
Figure 15:
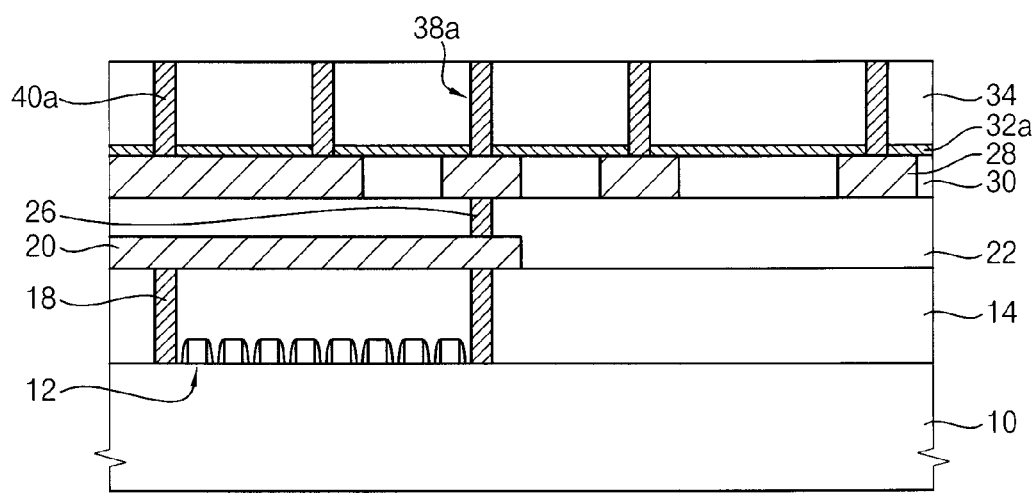
Figure 16:
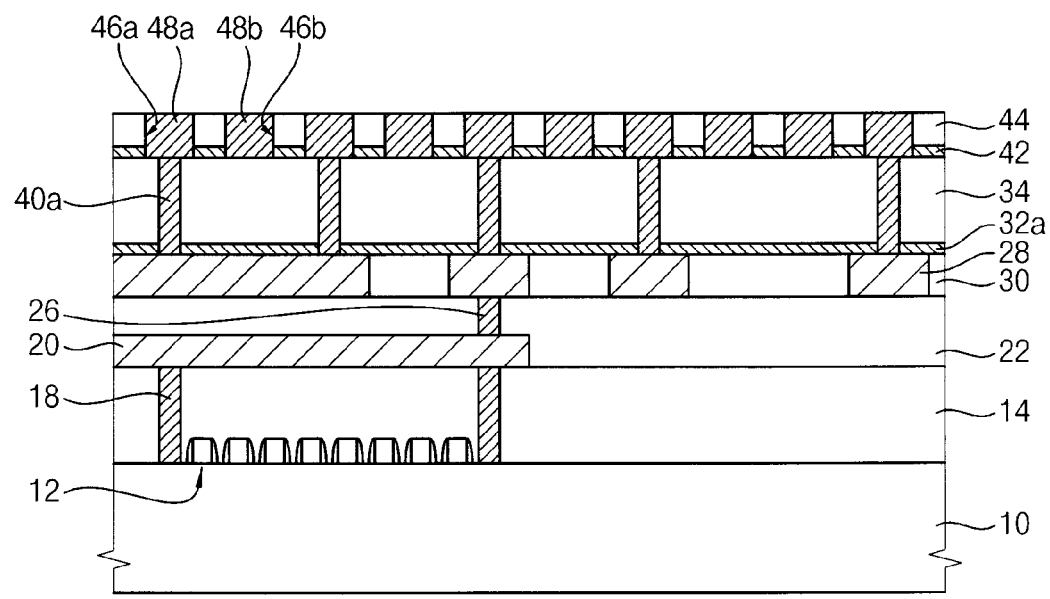

FIGS. 14 to 16 are cross-sectional views illustrating a method of manufacturing the semiconductor device in FIG. 12.

Referring to FIG. 14, a first insulating interlayer 14 and a first contact plug 18 may be formed on a substrate 10 having a transistor 12. A first conductive pattern 20 electrically connected to the first contact plug 18 may be formed on the first insulating interlayer 14. A second insulating interlayer 22 covering the first conductive pattern 20 may be formed on the first insulating interlayer 14, and a second contact plug 26 may be formed through the second insulating interlayer 22.

A second conductive pattern 28 electrically connected to the second contact plug 26 may be formed on the second insulating interlayer 22. A third insulating interlayer 30 may be formed on the second insulating interlayer 22 to surround a sidewall of the second conductive pattern 28. The above described processes may be substantially the same as or similar to those illustrated with reference to FIG. 3.

A first etch stop layer may be formed on the third insulating interlayer 30 and the second conductive pattern 28. A fourth insulating interlayer 34 may be formed on the first etch stop layer.

A first photoresist pattern 52 may be formed on the fourth insulating interlayer 34. The fourth insulating interlayer 34 and the first etch stop layer may be etched using the first photoresist pattern 52 as an etching mask. Thus, a third contact hole 38a may be formed through the fourth insulating interlayer 34 and the first etch stop layer to expose a top surface of the second conductive pattern 28. In the etching process, the first etch stop layer may be partially removed to form a first etch stop layer pattern 32a. After forming the third contact hole 38a, the first photoresist pattern 52 may be removed.

Referring to FIG. 15, a barrier layer may be formed on the exposed top surface of the second conductive pattern 28 an inner wall of the third contact hole 38a. A conductive layer may be formed on the barrier layer to fill the third contact hole 38a. The conductive layer and the barrier layer may be planarized by a CMP process to form a contact plug 40a.

Referring to FIG. 16, a second etch stop layer may be formed on the fourth insulating interlayer 34. A fifth insulating interlayer 44 may be formed on the second etch stop layer.

A second photoresist pattern (not shown) may be formed on the fifth insulating interlayer 44. The fifth insulating interlayer 44 and the second etch stop layer may be etched using the second photoresist pattern as an etching mask to form a third opening 46a and a dummy opening 46b. The third opening 46a and the dummy opening 46b may be formed simultaneously by a single etching process. In the etching process, the second etch stop layer may be partially removed to form a second etch stop layer pattern 42. A top surface of the third contact plug 40a may be exposed by the third opening 46a. A top surface of the fourth insulating interlayer 34 may be exposed by the dummy opening 46b.

A barrier layer may be formed on the exposed top surfaces of the third contact plug 40a and the fourth insulating interlayer 34, and an inner wall of the third opening 46a and the dummy opening 46b. A conductive layer may be formed on the barrier layer to fill the third opening 46a and the dummy opening 46b at the same time. The conductive layer may be formed using a metal that water vapor or gas may pass through. The conductive layer may be formed using, e.g., aluminum, aluminum alloy, copper, gold, silver, tungsten, molybdenum, etc.

The conductive layer and the barrier layer may be planarized by a CMP process to form a third conductive pattern 48a and a dummy conductive pattern 48b. The third conductive pattern 48a and the dummy conductive pattern 48b may be formed during the formation of the metal layer and the planarization. Therefore, an additional process for forming the dummy conductive pattern 48b may not be required.

As shown in the FIG. 12, a sixth insulating interlayer 50 may be formed on the fifth insulating interlayer 44 to cover the third conductive pattern 48a and the dummy conductive pattern 48b.

Figure 17:
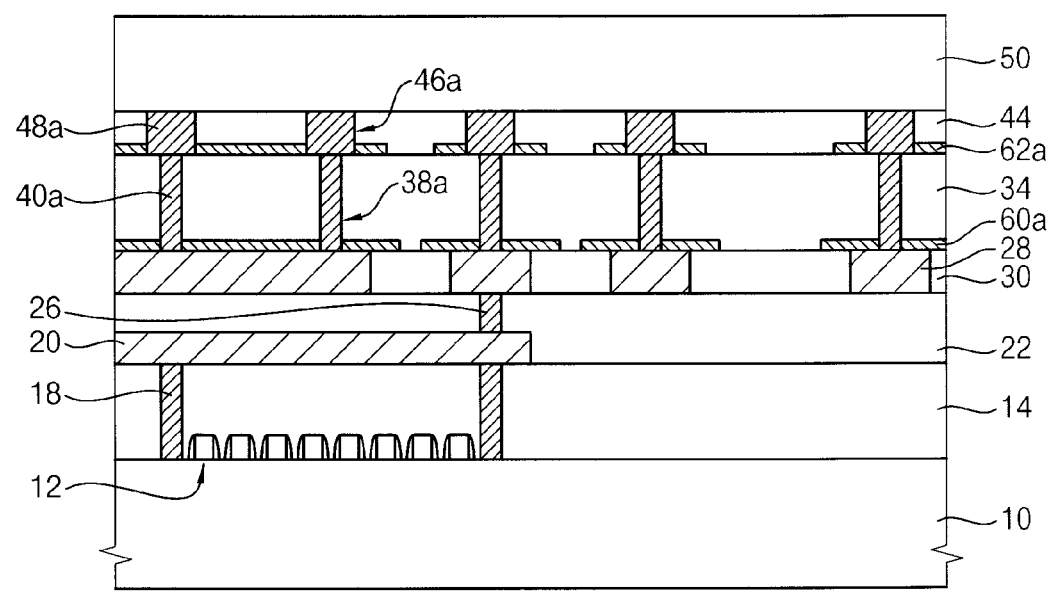

FIG. 17 is a cross-sectional view illustrating a semiconductor device in accordance with Embodiment 4.

Referring to FIG. 17, a switching element, e.g., a transistor 12 may be on a substrate 10. For example, the transistor 12 may be part of an integrated circuit including a plurality of switching elements and a plurality of transistors formed on the substrate 10. A first insulating interlayer 14 covering the transistor 12 may be on the substrate 10. A first contact plug 18 contacting the substrate 10 may be formed to pass through the first insulating interlayer 14. A first conductive pattern 20 may be formed on the first insulating interlayer 14. A second insulating interlayer 22 may cover the first conductive pattern 20. A second contact plug 26 electrically connected to the first conductive pattern 20 may be through the second insulating interlayer 22. A second conductive pattern 28 may be formed on the second insulating interlayer 22. A third insulating interlayer 30 may surround a sidewall of the second conductive pattern 28 on the second insulating interlayer 22.

A first etch stop layer pattern 60a may be on the third insulating interlayer 30 and the second conductive pattern 28. A fourth insulating interlayer 34 may be on the first etch stop layer pattern 60a. A third contact plug 40a contacting the second conductive pattern 28 may be formed through the fourth insulating interlayer 34 and the first etch stop layer pattern 60a. The third contact plug 40a may fill a contact hole 38a. The third contact plug 40a may serve as an active wiring of the semiconductor device.

The first etch stop layer pattern 60a may not be beneath the third contact plug 40a. Additionally, the first etch stop layer pattern 60a may not cover all area of the third insulating interlayer 30. The area of the third insulating interlayer 30 not covered by the first etch stop layer pattern 60a may be covered by the fourth insulating interlayer 34, and may serve as an exhaust path for gas and water vapor. In example embodiments, the first etch stop layer pattern 60a may cover only a portion of the third insulating interlayer 30 adjacent to the third contact plug 40a.

A second etch stop layer pattern 62a may be on the fourth insulating interlayer 34 and the third contact plug 40a. A fifth insulating interlayer 44 may be on the second etch stop layer pattern 62a. A third conductive pattern 48a contacting the third contact plug 40a may be formed to pass through the fifth insulating interlayer 44 and the second etch stop layer pattern 62a. The third conductive pattern 48a may fill an opening 46a.

The second etch stop layer pattern 62a may not be beneath the third conductive pattern 48a. Additionally, the second etch stop layer pattern 62a may not cover all area of the fourth insulating interlayer 34. The area of the fourth insulating interlayer 34 not covered by the second etch stop layer pattern 62a may be covered by the fifth insulating interlayer 44, and may serve as an exhaust path for gas and water vapor. In example embodiments, the second etch stop layer pattern 62a may cover only a portion of the fourth insulating interlayer 30 adjacent to the third conductive pattern 40a.

For example, the fifth insulating interlayer 44 may include, e.g., silicon oxide.

A sixth insulating interlayer 50 may be on the fifth insulating interlayer 44 and the third conductive pattern 48a.

In the semiconductor device, the first and second etch stop layer patterns 60a and 62amay not cover all areas of the third and fourth insulating interlayers, respectively. Therefore, portions of the third and fourth insulating interlayers 60a and 62a not covered by the first and second etch stop layer patterns 60a and 62a may serve as an exhaust path for gas and water vapor. Accordingly, the exhaust path of gas and water vapor may increase, so that gas trapped in underlying layers may be easily exhausted.

Figure 18:
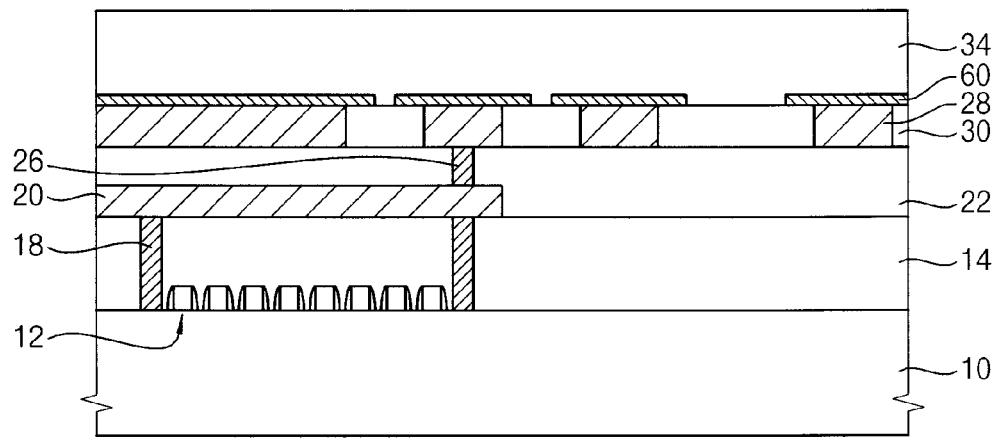
Figure 19:
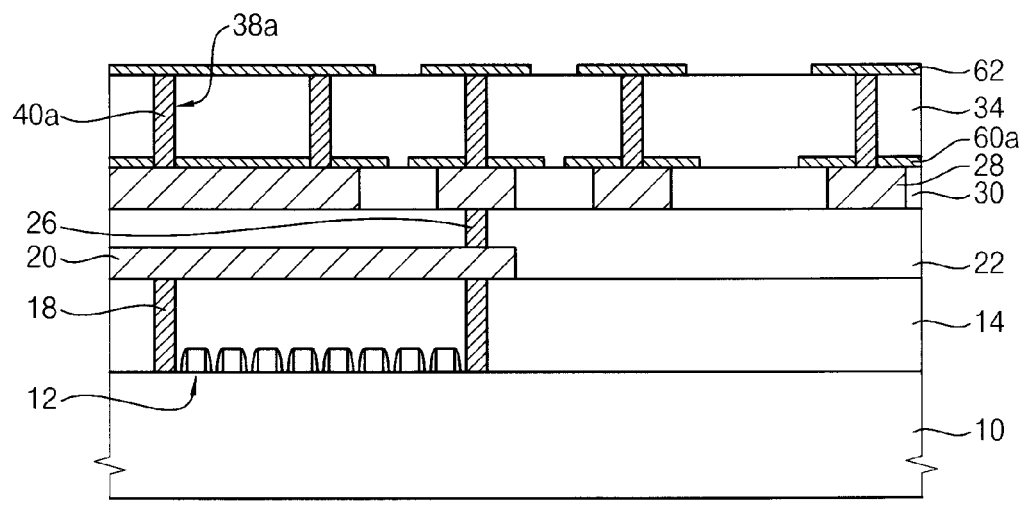
Figure 20:
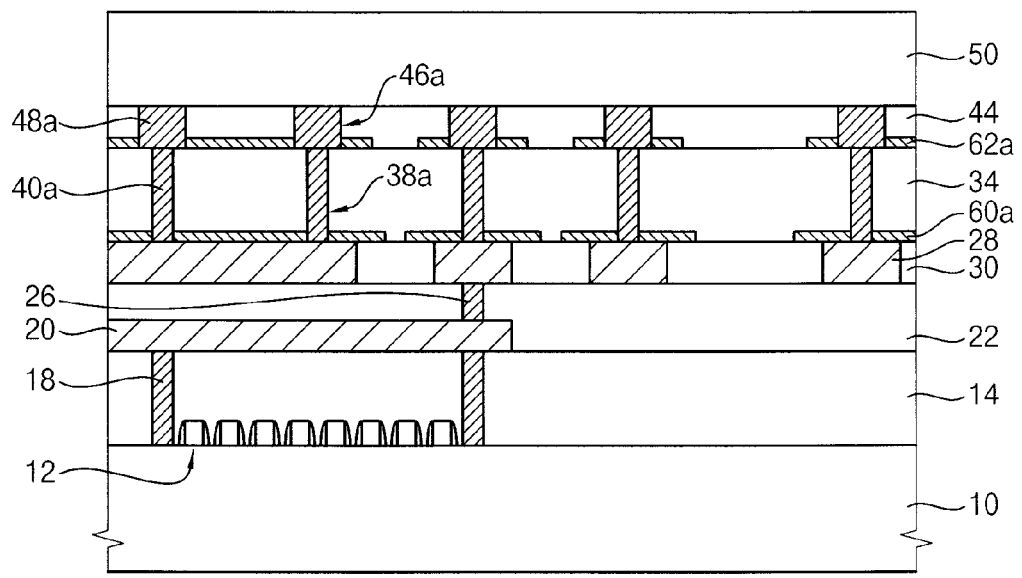

FIGS. 18 to 20 are cross-sectional views illustrating an exemplary method of manufacturing the semiconductor device in FIG. 17.

Referring to FIG. 18, a first insulating interlayer 14 and a first contact plug 18 may be formed on a substrate 10 having a transistor 12. A first conductive pattern 20 electrically connected to the first contact plug 18 may be formed on the first insulating interlayer 14. A second contact plug 26 and a second insulating interlayer 22 covering the first conductive pattern 20 may be formed on the first insulating interlayer 14. A second conductive pattern 28 electrically connected to the second contact plug 26 may be formed on the second insulating interlayer 22. A third insulating interlayer 30 may be formed on the second insulating interlayer 22 to surround a sidewall of the second conductive pattern 28. The above described processes may be substantially the same as or similar to those illustrated with reference to FIG. 3.

A first etch stop layer may be formed on the third insulating interlayer 30 and the second conductive pattern 28. The first etch stop layer may be patterned to form a first preliminary etch stop layer pattern 60. The first preliminary etch stop layer pattern 60 may be formed to cover a top surface of the third insulating interlayer 30 that is relatively adjacent to the second conductive pattern 28 and may expose a top surface of the third insulating interlayer 30 that is relatively far from the second conductive pattern 28.

A fourth insulating interlayer 34 may be formed on the first preliminary etch stop layer pattern 60 and the third insulating interlayer 30.

Referring to FIG. 19, a first photoresist pattern (not shown) may be formed on the fourth insulating interlayer 34. The fourth insulating interlayer 34 and the first preliminary etch stop layer pattern 60 may be etched using the first photoresist pattern as an etching mask. Thus, a contact hole 38a may be formed through the fourth insulating interlayer 34 and the first preliminary etch stop layer pattern 60 to expose a top surface of the second conductive pattern 28. In the etching process, the first preliminary etch stop layer pattern may be partially removed to form a first etch stop layer pattern 60a. After forming the contact hole, the first photoresist pattern may be removed.

A barrier layer may be formed on the exposed top surface of the second conductive pattern 28 and an inner wall of the contact hole 38a. A conductive layer may be formed on the barrier layer to fill the contact hole 38a. The conductive layer and the barrier layer may be planarized by a CMP process to form a third contact plug 40a.

A second etch stop layer may be formed on the fourth insulating interlayer 34. The second etch stop layer may be patterned to form a second preliminary etch stop layer pattern 62. The second preliminary etch stop layer pattern 62 may be formed to cover a top surface of the fourth insulating interlayer 34 that is relatively adjacent to the third contact plug 40a and to expose a top surface of the fourth insulating interlayer 34 that is relatively far from the third contact plug 40a.

Referring to FIG. 20, a fifth insulating interlayer 44 may be formed on the second preliminary etch stop layer pattern 62. A second photoresist pattern (not shown) may be formed on the fifth insulating interlayer 44. The fifth insulating interlayer 44 and the second preliminary etch stop layer pattern 62 may be etched using the second photoresist pattern as an etching mask to form an opening 46a. A top surface of the third contact plug 40a may be exposed by the opening 46a. In the etching process, the second preliminary etch stop layer pattern 62 may be partially removed to form a second etch stop layer pattern 62a. The fifth insulating interlayer 44 may surround a sidewall of the second etch stop layer pattern 62a.

A barrier layer may be formed on the exposed top surface of the third contact plug 40a and an inner wall of the opening 46a. A conductive layer may be formed on the barrier layer formed to fill the opening 46a. The conductive layer and the barrier layer may be planarized by a CMP process to form a third conductive pattern 48a.

A sixth insulating interlayer 50 may be formed on the fifth insulating interlayer 44 to cover the third conductive pattern 48a.

Figure 21:
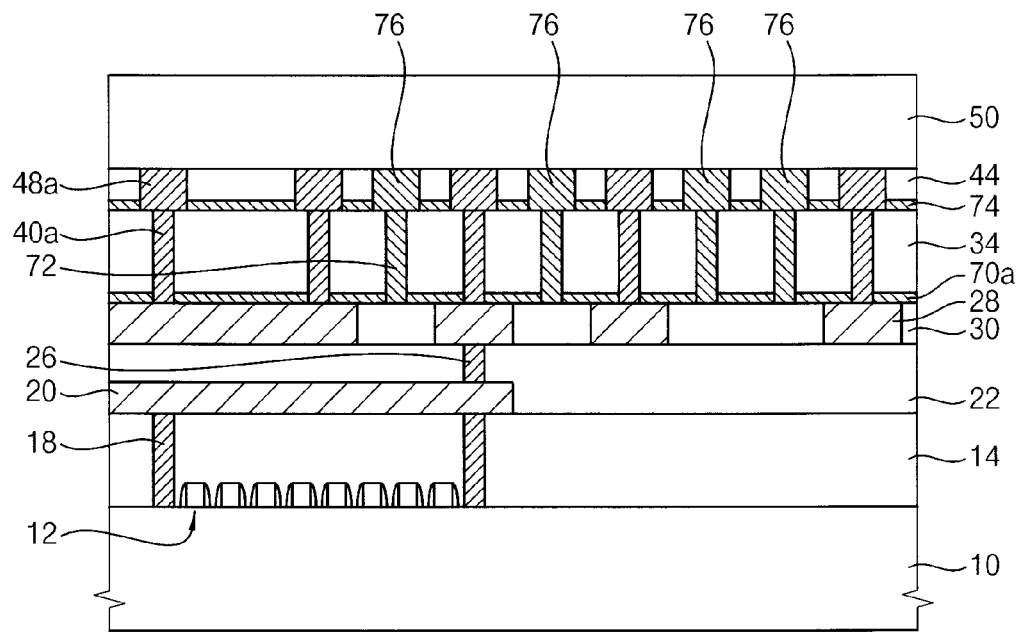

FIG. 21 is a cross-sectional view illustrating a semiconductor device in accordance with Embodiment 5.

Referring to FIG. 21, a switching element, e.g., a transistor 12 may be on a substrate 10. For example, the transistor 12 may be part of an integrated circuit including a plurality of switching elements and a plurality of transistors formed on the substrate 10. A first insulating interlayer 14 covering the transistor 12 may be on the substrate 10. A first contact plug 18 contacting the substrate 10 may be formed through the first insulating interlayer 14. A first conductive pattern 20 connected to the first contact plug 18 may be on the first insulating interlayer 14. A second insulating interlayer 22 may cover the first conductive pattern 20. A second contact plug 26 electrically connected to the first conductive pattern 20 may be formed through the second insulating interlayer 22.

A second conductive pattern 28 may be on the second insulating interlayer 22. A third insulating interlayer 30 may surround a sidewall of the second conductive pattern 28. A first etch stop layer pattern 70a may be on the third insulating interlayer 30 and the second conductive pattern 28. A fourth insulating interlayer 34 may be on the first etch stop layer pattern 70a.

A third contact plug 40a contacting the second conductive pattern 28 may be formed through the fourth insulating interlayer 34 and the first etch stop layer pattern 70a. The third contact plug 40a may serve as an active wiring of the semiconductor device.

A dummy contact 72 contacting the third insulating interlayer 30 may be formed through the fourth insulating interlayer 34. The dummy contact 72 may include a material different from that of the third contact plug 40a and the first etch stop layer pattern 70a. The dummy contact 72 may include a material that water vapor and gas may easily pass through. For example, the dummy contact 72 may include polysilicon. The dummy contact 72 may not serve as an active wiring. However, the dummy contact 72 may be an exhaust path of water vapor and gas included in underlying layers.

A third conductive pattern 48a contacting the third contact plug 40a may be on the fourth insulating interlayer 34. Further, a dummy pattern 76 may make contact with the fourth insulating interlayer 34. The third conductive pattern 48a and the dummy pattern 76 may include materials different from each other. The dummy pattern 76 may include a material that water vapor and gas may easily pass through. For example, the dummy pattern 76 may include polysilicon. The dummy pattern 76 may not serve as an active wiring. However, the dummy pattern 76 may be an exhaust path for water vapor and gas included in underlying layers.

A second etch stop layer pattern 74 may be on the fourth insulating interlayer 34 which may surround sidewalls of the third conductive pattern 48a and the dummy pattern 76. A fifth insulating interlayer 44 may be on the second etch stop layer pattern 74.

A sixth insulating interlayer 50 covering the third conductive pattern 48a and the dummy pattern 76 may be on the fifth insulating interlayer 44.

Figure 22:
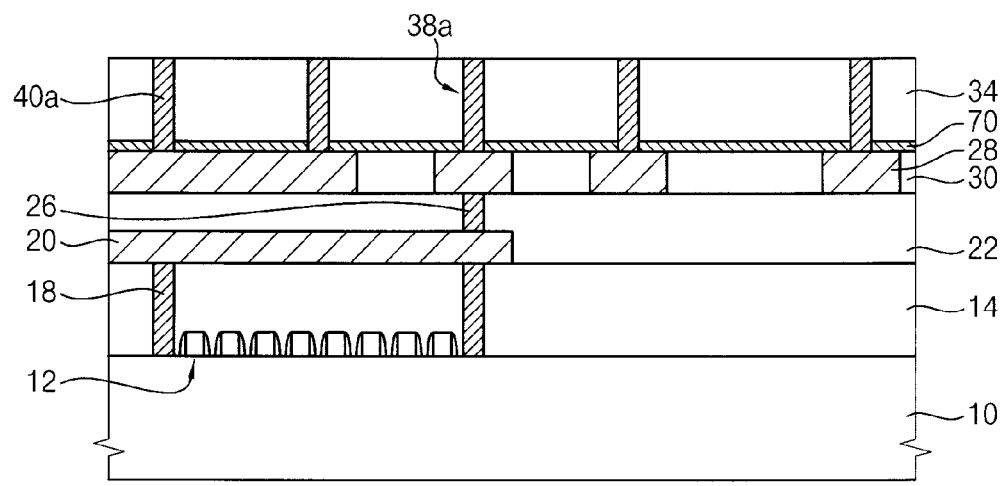
Figure 23:
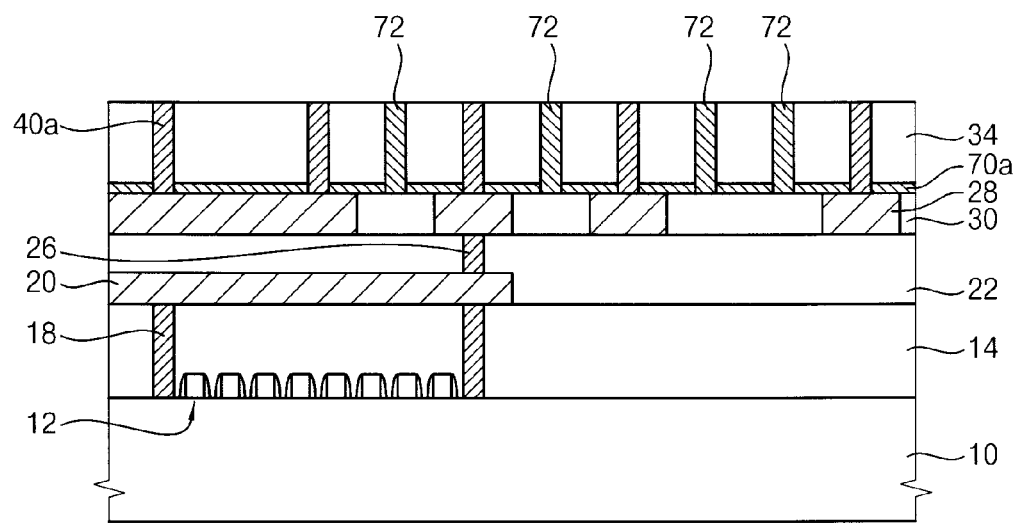
Figure 24:
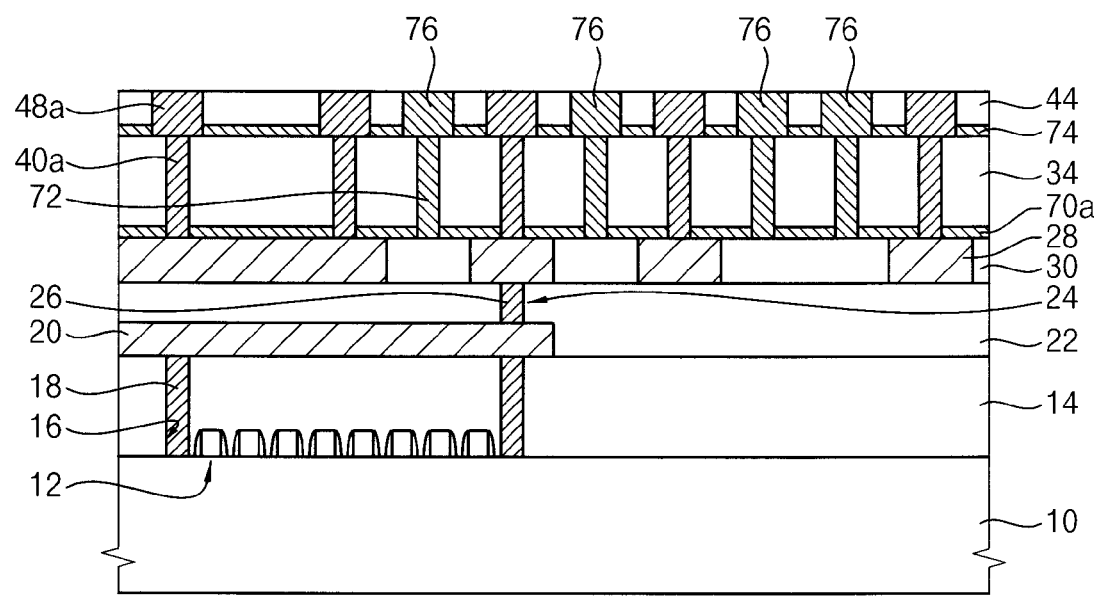

FIGS. 22 to 24 are cross-sectional views illustrating an exemplary method of manufacturing the semiconductor device shown in FIG. 21.

Referring to FIG. 22, a first insulating interlayer 14 and a first contact plug 18 may be formed on a substrate 10 having a transistor 12. A first conductive pattern 20 electrically connected to the first contact plug 18 may be formed on the first insulating interlayer 14. A second contact plug 26 and a second insulating interlayer 22 covering the first conductive pattern 20 may be formed on the first insulating interlayer 14. A second conductive pattern 28 electrically connected to the second contact plug 26 may be formed on the second insulating interlayer 22. A third insulating interlayer 30 may be formed on the second insulating interlayer 22 to surround a sidewall of the second conductive pattern 28. The above described processes may be substantially the same as or similar to those illustrated with reference to FIG. 3.

A first etch stop layer may be formed on the third insulating interlayer 30 and the second conductive pattern 28. A fourth insulating interlayer 34 may be formed on the first etch stop layer.

The fourth insulating interlayer 34 and the first etch stop layer may be partially etched to form a third contact hole 38a exposing the second conductive pattern 28. In the etching process, a first preliminary etch stop layer pattern 70 may be formed. A first conductive layer may fill the third contact hole 38a to form a third contact plug 40a.

Referring to FIG. 23, the fourth insulating interlayer 34 and the first preliminary etch stop layer pattern 70 may be partially etched to form a dummy contact hole partially exposing the third insulating interlayer 30 surrounding the second conductive pattern 28. A first etch stop layer pattern 70a may be formed during the formation of the dummy contact hole. The dummy contact hole may be filled with a first filling layer, and the first filling layer may be planarized to form a dummy contact 72. The first filling layer may be formed using a material different from that of the first conductive layer. The first filling layer may be formed using a material, through which gases included in underlying layers may easily pass. The first filling layer may include polysilicon.

Referring to FIG. 24, a second etch stop layer may be formed on the fourth insulating interlayer 34. A fifth insulating interlayer 44 may be formed on the second etch stop layer.

The fifth insulating interlayer 44 and the second etch stop layer may be partially etched to form a third opening. A second etch stop layer pattern 74 may be formed during the formation of the third opening. A top surface of the third contact plug 40a may be exposed by the third opening. The third opening may be filled with a second conductive layer, and the second conductive layer may be planarized to form a third conductive pattern 48a.

The fifth insulating interlayer 44 and the second etch stop layer may be partially etched to form a dummy opening. A top surface of the fourth insulating interlayer 34 may be exposed by the dummy opening.

A second filling layer may be filled into the dummy opening, and the second filling layer may be planarized to form a dummy pattern 76. The second filling layer may be formed using a material different from that of the second conductive layer. The second filling layer may be formed using a material, through which gases included in underlying layers may easily pass. The second filling layer may include polysilicon.

As shown in FIG. 21, a sixth insulating interlayer 50 may be formed on the fifth insulating interlayer 44 to cover the third conductive pattern 48a and the dummy pattern 76.

The example embodiments above described may be employed in different types of semiconductor devices, such as DRAM (including DDR and SDRAM), NAND flash, NOR flash, RRAM, PRAM, and MRAM, or other memory devices etc. In addition, aspects of the disclosed embodiments may be used in systems such as cell phones, PDAs, tablet computers, laptops, desktop computers, microprocessor systems, digital signal processors, communication system processors, or other systems.

The semiconductor device and the system according to the above described example embodiments may be mounted on a printed circuit board (PCB) by using various packages. These various packages may include, for example, PoP (Package on Package), BGAs (Ball grid arrays), CSPs (Chip scale packages), PLCC (Plastic Leaded Chip Carrier), PDIP (Plastic Dual In-Line Package), Die in Waffle Pack, Die in Wafer Form, COB (Chip On Board), CERDIP (Ceramic Dual In-Line Package), MQFP (Plastic Metric Quad Flat Pack), TQFP (Thin Quad Flat-Pack), SOIC (Small Outline Integrated Circuit), SSOP (Shrink Small Outline Package), TSOP (Thin Small Outline Package), TQFP (Thin Quad Flat-Pack), SIP (System In Package), MCP (Multi Chip Package), WFP (Wafer-level Fabricated Package) and WSP (Wafer-Level Processed Stack Package).

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present disclosure. Accordingly, all such modifications are intended to be included within the scope of the present inventive concept as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A method of manufacturing a semiconductor device, the method comprising:
    forming a first insulating interlayer on a substrate;
    forming a first wiring to pass through the first insulating interlayer;
    sequentially forming a first etch stop layer and a second insulating interlayer on the first insulating interlayer;
    partially removing the second insulating interlayer and the first etch stop layer to form therethrough a plurality of contact holes including a first contact hole and a plurality of dummy contact holes including a first dummy contact hole, the first contact hole exposing the first wiring;
    filling the contact holes and the dummy contact holes with a same conductive material to form a plurality of contact plugs including a first contact plug and a plurality of dummy contact plugs including a first dummy contact plug, respectively, the first contact plug and the first dummy contact plug electrically isolated from each other;
    sequentially forming a second etch stop layer and a third insulating interlayer on the second insulating interlayer; and
    forming a first conductive pattern and a first dummy conductive pattern to pass through the third insulating interlayer and the second etch stop layer, the first conductive pattern and the first dummy conductive pattern electrically isolated from each other, the first conductive pattern contacting the first contact plug,
    wherein the first contact plug contacts the first wiring, and
    wherein the first dummy conductive pattern is electrically isolated from any dummy contact plug.

2. The method of claim 1, wherein forming the first wiring includes:
    partially removing the first insulating interlayer to form a second contact hole;
    filling the second contact hole with a conductive material to form a second contact plug; and
    forming a second conductive pattern contacting the second contact plug.

3. The method of claim 1, wherein the first insulating interlayer is disposed directly below the first etch stop layer, and the first dummy contact plug and first dummy conductive pattern are electrically isolated from any conductive pattern on the first insulating interlayer.

4. The method of claim 1, wherein each layer of the first and second etch stop layers is formed to include at least one selected from the group consisting of silicon nitride (SiN), silicon carbide (SiC), and silicon carbon nitride (SiCN).

5. The method of claim 1, wherein the first conductive pattern and the first dummy conductive pattern are formed using the same material.

6. The method of claim 5, wherein the first conductive pattern and the first dummy conductive pattern include copper.

7. The method of claim 1, wherein each of the first dummy contact hole and the first dummy conductive pattern is formed in at least one of a cell region and a peripheral region of the substrate.

8. The method of claim 1, further comprising:
    forming a second dummy contact hole to pass through the second insulating interlayer and the first etch stop layer; and
    filling the second dummy contact hole with a conductive material to form a second dummy contact plug isolated from the first contact plug.

9. The method of claim 1, further comprising:
    forming a second dummy conductive pattern to pass through the third insulating interlayer and the second etch stop layer, and disposed on the second insulating interlayer, at the same time as forming the first dummy conductive pattern, the second dummy conductive pattern connected to the first dummy contact plug and isolated from the first dummy conductive pattern.

10. The method of claim 1, wherein the first etch stop layer includes a first opening at a first portion of the second insulating interlayer,
    wherein the second etch stop layer includes a second opening at a second portion of the third insulating interlayer corresponding to the first portion, and
    wherein the first and second openings are not filled with any contact plug.

11. A method of manufacturing a semiconductor device, the method comprising:
    forming an integrated circuit on a substrate;
    forming a first insulating layer on the substrate;
    forming a first conductive pattern to pass through the first insulating layer;
    sequentially forming a first etch stop layer and a second insulating layer on the first insulating layer and the first conductive pattern;
    simultaneously forming a contact hole and a dummy contact hole;
    forming a second etch stop layer and a third insulating interlayer on the second insulating interlayer; and
    forming a second conductive pattern and a dummy conductive pattern to pass through the third insulating interlayer and the second etch stop layer, the second conductive pattern and the dummy conductive pattern electrically insolated from each other,
    wherein the contact hole is formed on the first conductive pattern through the first etch stop layer and the second insulating layer, and is filled with a conductive material to form a contact plug electrically connected to the first conductive pattern and the integrated circuit,
    wherein the dummy contact hole is formed on the first insulating layer through the first etch stop layer and the second insulating layer, and is filled with the same conductive material to form a dummy contact plug electrically isolated from the integrated circuit, and
    wherein the second conductive pattern contacts the contact plug and the dummy conductive pattern is electrically isolated from any dummy contact plug.

12. The method of claim 11, wherein the second conductive pattern and the dummy conductive pattern are formed using the same material.

13. The method of claim 11, wherein each of the first and second etch stop layers is formed to include at least one selected from the group consisting of silicon nitride (SiN), silicon carbide (SiC), and silicon carbon nitride (SiCN), respectively.

14. The method of claim 11, wherein the first etch stop layer includes a first opening at a first portion of the second insulating interlayer between the contact plug and the dummy contact plug, the first opening not filled with any contact plug.

15. A method of manufacturing a semiconductor device, comprising:
  forming an integrated circuit on a substrate;
  forming a first insulating layer on the substrate;
  forming a plurality of first conductive patterns to pass through the first insulating layer;
  forming a second insulating layer and a third insulating layer sequentially stacked on the first insulating layer;
  forming a plurality of first contact plugs electrically connected to the plurality of first conductive patterns, the plurality of first contact plugs formed through the second insulating layer and the third insulating layer;
  forming a plurality of second contact plugs contacting the first insulating layer, the plurality of second contact plugs formed through the second insulating layer and the third insulating layer and at the same time as forming the plurality of first contact plugs;
  forming a plurality of second conductive patterns electrically connected to the plurality of first contact plugs and disposed on the third insulating layer; and
  forming a plurality of third conductive patterns on the third insulating layer at the same time as forming the plurality of second conductive patterns,
  wherein the plurality of second contact plugs are electrically isolated from the integrated circuit, and
  wherein the plurality of third conductive patterns are electrically isolated from the integrated circuit and from any contact plugs.

16. The method of claim 15, further comprising:
  forming a fourth insulating layer and a fifth insulating layer sequentially stacked on the third insulating layer and the plurality of first and second contact plugs.

17. The method of claim 15, wherein the plurality of first and second contact plugs are formed using the same material.

18. The method of claim 16, wherein the second and fourth insulating layers include at least one selected from the group consisting of silicon nitride (SiN), silicon carbide (SiC), and silicon carbon nitride (SiCN), respectively.

19. The method of claim 16, wherein the plurality of second and third conductive patterns are formed using the same material.

20. The method of claim 15, wherein the second insulating layer includes a first opening at a first portion of the third insulating interlayer between one of the first contact plugs and one of the second contact plugs, the first opening not filled with any contact plug.

* * * * *